(12) United States Patent
Hayashi et al.

(10) Patent No.: US 12,446,259 B2
(45) Date of Patent: Oct. 14, 2025

(54) FIELD-EFFECT TRANSISTOR INCLUDING TRANSPARENT OXIDE AND LIGHT-SHIELDING MEMBER, AND DISPLAY UTILIZING THE TRANSISTOR

(71) Applicant: CANON KABUSHIKI KAISHA, Tokyo (JP)

(72) Inventors: Ryo Hayashi, Yokohama (JP); Masafumi Sano, Yokohama (JP); Katsumi Abe, Kawasaki (JP); Hideya Kumomi, Tokyo (JP); Kojiro Nishi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/327,289

(22) Filed: Jun. 1, 2023

(65) Prior Publication Data
US 2023/0307546 A1    Sep. 28, 2023

Related U.S. Application Data

(60) Continuation of application No. 17/218,830, filed on Mar. 31, 2021, now Pat. No. 11,705,523, which is a
(Continued)

(30) Foreign Application Priority Data

Oct. 20, 2005    (JP) .................. 2005-305950

(51) Int. Cl.
*H10D 30/67* (2025.01)
*G02F 1/1368* (2006.01)
(Continued)

(52) U.S. Cl.
CPC ....... *H10D 30/6723* (2025.01); *G02F 1/1368* (2013.01); *H10D 30/6755* (2025.01);
(Continued)

(58) Field of Classification Search
CPC ........... H01L 29/78633; H01L 27/1225; H01L 29/7869; H01L 29/78693; G02F 1/1368;
(Continued)

(56) References Cited

U.S. PATENT DOCUMENTS 5,368,991 A    11/1994    Uchikawa et al.
5,622,653 A     4/1997    Orita et al.
(Continued)

FOREIGN PATENT DOCUMENTS

JP    H05-251705    9/1993
JP    H09-160014    6/1997
(Continued)

OTHER PUBLICATIONS

Fortunato, et al., Fully Transparent ZnO Thin-Film Transistor Produced at Room Temperature, Adv. Mater., vol. 17, 1 No. 5 (2005) 590-94.
(Continued)

*Primary Examiner* — Julia Slutsker
(74) *Attorney, Agent, or Firm* — VENABLE LLP (57) ABSTRACT

A field-effect transistor includes a substrate, a source electrode, a drain electrode, a gate electrode, a gate-insulating film, and an active layer. The active layer contains an oxide having a transmittance of 70% or more in the wavelength range of 400 to 800 nm. A light-shielding member is provided as a light-shielding structure for the active layer, for example, on the bottom face of the substrate.

30 Claims, 5 Drawing Sheets

Related U.S. Application Data continuation of application No. 16/566,090, filed on Sep. 10, 2019, now abandoned, which is a division of application No. 14/676,693, filed on Apr. 1, 2015, now abandoned, which is a division of application No. 11/583,022, filed on Oct. 19, 2006, now abandoned.

(51) Int. Cl.
*H10D 86/40* (2025.01)
*H10D 86/60* (2025.01)
*H10K 59/123* (2023.01)
*H10K 59/126* (2023.01)
*H10K 102/00* (2023.01)

(52) U.S. Cl.
CPC ....... *H10D 30/6756* (2025.01); *H10D 86/423* (2025.01); *H10D 86/60* (2025.01); *H10K 59/123* (2023.02); *H10K 59/126* (2023.02); *H10K 2102/311* (2023.02)

(58) Field of Classification Search
CPC ............. H10K 59/123; H10K 59/126; H10K 2102/311
See application file for complete search history.

(56) References Cited

U.S. PATENT DOCUMENTS

| | | | |
|---|---|---|---|
| 5,781,254 | A | 7/1998 | Kim et al. |
| 5,811,866 | A | 9/1998 | Hirata |
| 5,970,361 | A | 10/1999 | Kumomi et al. |
| 6,058,945 | A | 5/2000 | Fujiyama et al. |
| 6,123,824 | A | 9/2000 | Sano et al. |
| 6,172,296 | B1 | 1/2001 | Iwasaki et al. |
| 6,236,063 | B1 | 5/2001 | Yamazaki et al. |
| 6,262,436 | B1 | 7/2001 | Nakata |
| 6,303,945 | B1 | 10/2001 | Saito et al. |
| 6,331,474 | B1 | 12/2001 | Hayashi et al. |
| 6,344,608 | B2 | 2/2002 | Kariya et al. |
| 6,399,873 | B1 | 6/2002 | Sano et al. |
| 6,472,248 | B2 | 10/2002 | Shiozaki et al. |
| 6,488,995 | B1 | 12/2002 | Nishimoto et al. |
| 6,613,603 | B1 | 9/2003 | Sano |
| 6,635,899 | B2 | 10/2003 | Saito et al. |
| 6,653,165 | B2 | 11/2003 | Kondo et al. |
| 6,677,613 | B1 | 1/2004 | Yamazaki |
| 6,706,336 | B2 | 3/2004 | Kondo et al. |
| 6,794,275 | B2 | 9/2004 | Kondo et al. |
| 6,812,499 | B2 | 11/2004 | Kondo et al. |
| 6,835,888 | B2 | 12/2004 | Sano et al. |
| 6,838,308 | B2 | 1/2005 | Haga |
| 6,855,621 | B2 | 2/2005 | Kondo et al. |
| 6,858,308 | B2 | 2/2005 | Kondo et al. |
| 7,001,460 | B2 | 2/2006 | Saito et al. |
| 7,061,014 | B2 | 6/2006 | Hosono et al. |
| 7,064,263 | B2 | 6/2006 | Sano et al. |
| 7,242,039 | B2 | 7/2007 | Hoffman et al. |
| 7,462,514 | B2 | 12/2008 | Shiroguchi et al. |
| 7,462,862 | B2 | 12/2008 | Hoffman et al. |
| 7,791,072 | B2 | 9/2010 | Kumoni et al. |
| 2001/0022565 | A1 | 9/2001 | Kimura |
| 2002/0060756 | A1 | 5/2002 | Kurashina |
| 2002/0121640 | A1* | 9/2002 | Yamazaki ................ H01L 27/12 257/E29.282 |
| 2002/0145140 | A1* | 10/2002 | Katayama .............. H10D 86/60 438/455 |
| 2003/0025847 | A1 | 2/2003 | Sumi |
| 2003/0116768 | A1 | 6/2003 | Ishikawa |
| 2004/0135148 | A1* | 7/2004 | Lin ....................... H10D 86/00 257/E27.111 |
| 2004/0140297 | A1 | 7/2004 | Tanaka et al. |
| 2004/0191949 | A1 | 9/2004 | Iwata et al. |
| 2004/0191950 | A1 | 9/2004 | Nakamura et al. |
| 2004/0195961 | A1 | 10/2004 | Lin |
| 2004/0221887 | A1 | 11/2004 | Kondo et al. |
| 2004/0251827 | A1 | 12/2004 | Kang et al. |
| 2005/0039670 | A1 | 2/2005 | Hosono et al. |
| 2005/0087769 | A1* | 4/2005 | Yamazaki ........... H01L 27/1259 257/202 |
| 2005/0156239 | A1* | 7/2005 | Seko .................. H01L 29/66757 438/164 |
| 2005/0168135 | A1 | 8/2005 | Iga |
| 2005/0199880 | A1* | 9/2005 | Hoffman ............ H10D 30/6755 257/72 |
| 2005/0199960 | A1 | 9/2005 | Hoffman et al. |
| 2005/0275038 | A1* | 12/2005 | Shih .................. H01L 29/78648 257/382 |
| 2005/0282308 | A1 | 12/2005 | Uhlig et al. |
| 2006/0046512 | A1 | 3/2006 | Nakamura et al. |
| 2006/0091793 | A1 | 5/2006 | Baude et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2007/0194379 | A1 | 8/2007 | Hosono et al. |
| 2018/0190944 | A1 | 7/2018 | Lee et al. |

FOREIGN PATENT DOCUMENTS

| | | |
|---|---|---|
| JP | 2000-044236 | 2/2000 |
| JP | 2004-103957 | 4/2004 |
| JP | 2005-077822 | 3/2005 |
| JP | 2005-286317 | 10/2005 |
| JP | 2005-302808 | 10/2005 |
| WO | 2002/017368 | 2/2002 |
| WO | 2003/040441 | 5/2003 |
| WO | 2005/088726 | 9/2005 |
| WO | 2005/093848 | 10/2005 |
| WO | 2005/093850 | 10/2005 |
| WO | 2005/093851 | 10/2005 |

OTHER PUBLICATIONS

Carcia, et al., "Transparent ZnO thin-film transistor fabricated by rf magnetron sputtering", Applied Physics Letters, vol. 82, No. 7 (2003) 1117-19.

Fortunato, et al., "High field-effect mobility zinc oxide thin film transistors produced at room temperature", Journal of Non-Crystalline Solids, vol. 338-340 (2004) 806-9.

Fortunato, et al., "Wide-bandgap high-mobility ZnO thin-film transistors produced at room temperature", vol. 85, No. 13 (2004) 2541-43.

Heo, et al., "Depletion-mode ZnO nanowire field-effect transistor", Applied Physics Letters, vol. 85, No. 12 (2004) 2274-76.

Hoffman, et al., "ZnO-based transparent thin-film transistors", Applied Physics Letters, vol. 82, No. 5 (2003) 733-5.

Kwon, et al., "Enhancement-mode thin-film field-effect transistor using phosphorus-doped (Zn,Mg)O channel", Applied Physics Letters, vol. 84, No. 14 (2004) 2685-87.

Narushima, A p-type amorphous oxide semiconductor and room temperature fabrication of amorphous oxide p-n heterojunction diodes, Adv. Mat. 15 (2003) 1409-13.

Nishii, et al., "High Mobility Thin Film Transistors with Transparent ZnO Channels", Jpn. J. Appl. Phys., vol. 42, Pt. 2, No. 4A (2003) L347-49.

Nomura, et al., "Carrier transport of extended and localized states in $InGaO_3(ZnO)5$", Mat. Res. Soc. Symp. Proc., vol. 811 (2004) E2.9.1-E2.9.6.

Nomura, et al., "Room-temperature fabrication of transparent flexible thin-film transistors using amorphous oxide semiconductors", Nature, vol. 432 (2004) 488-92.

Ohya, et al., "Thin Film Transistor of ZnO Fabricated by Chemical Solution Deposition", Jpn. J. Appl. Phys., vol. 40, Pt. 1, No. 1 (2001) 297-98.

Shibuya, et al., "Single crystal $SrTiO_3$ field-effect transistor with an atomically flat amorphous $CaHfO_3$ gate insulator", Applied Physics Letters, vol. 85, No. 3 (2004) 425-27.

(56) References Cited

OTHER PUBLICATIONS

Takagi, et al., "Carrier transport and electronic structure in amorphous oxide semiconductor, a-InGaZn04", Thin Solid Films, vol. 486 (2005) 38-41.

Yabuta, et al., "High-mobility thin-film transistor with amorphous InGaZnO4 channel fabricated by room temperature rf-magnetron sputtering", Applied Physics Letters, vol. 89 (2006) 112123-1 to 112123-3.

* cited by examiner

FIG. 8

FIELD-EFFECT TRANSISTOR INCLUDING TRANSPARENT OXIDE AND LIGHT-SHIELDING MEMBER, AND DISPLAY UTILIZING THE TRANSISTOR

This application is a continuation of application Ser. No. 17/218,830 filed Mar. 31, 2021, which is a continuation of application Ser. No. 16/566,090 filed Sep. 10, 2019 (now abandoned), which is a division of application Ser. No. 14/676,693 filed Apr. 1, 2015 (now abandoned), which is a division of application Ser. No. 11/583,022 filed Oct. 19, 2006 (now abandoned), which claims the benefit of Japanese Application No. 2005-305950 filed Oct. 20, 2005, which are hereby incorporated by reference herein in their entirety.

BACKGROUND OF THE INVENTION

Field of the Invention

The present invention relates to transistors using amorphous oxides and displays utilizing the transistors.

Description of the Related Art

Recently, technologies in which transparent amorphous oxide semiconductor films composed of indium, gallium, zinc, and oxygen are applied to channel layers of thin-film transistors (TFTs) have been developed. For example, International Publication No. WO 2005/088726 (Patent Document) discloses a technology for using an InGaZn system transparent amorphous oxide film as the channel layer of a TFT.

This transparent amorphous oxide semiconductor film can be formed at a low temperature and is transparent to visible light. Therefore, a flexible and transparent TFT can be formed on a substrate such as a plastic sheet or film.

In Nature (2004), 432, 488-492 (Non-Patent Document), it is disclosed that a transparent amorphous oxide semiconductor film has a visible light transmittance of about 80% or more when the composition ratio by fluorescent X-ray analysis is In:Ga:Zn=1.1:1.1:0.9, and that it is possible to produce a transparent TFT.

The present inventors have conducted studies in order to produce transparent field-effect transistors by using transparent amorphous oxide semiconductor films and have found adventitiously a phenomenon that electrical conductivity changes under visible light having a certain wavelength.

In order to investigate the phenomenon in detail, the present inventors have conducted experiments for measuring electrical conductivity under exposure to spectral light as described below (spectral sensitivity measurement experiments). As a result, a change (increase) in electrical conductivity caused by light absorption was observed in a region at the shorter-wavelength side of visible light (FIG. 8).

Figure 8:
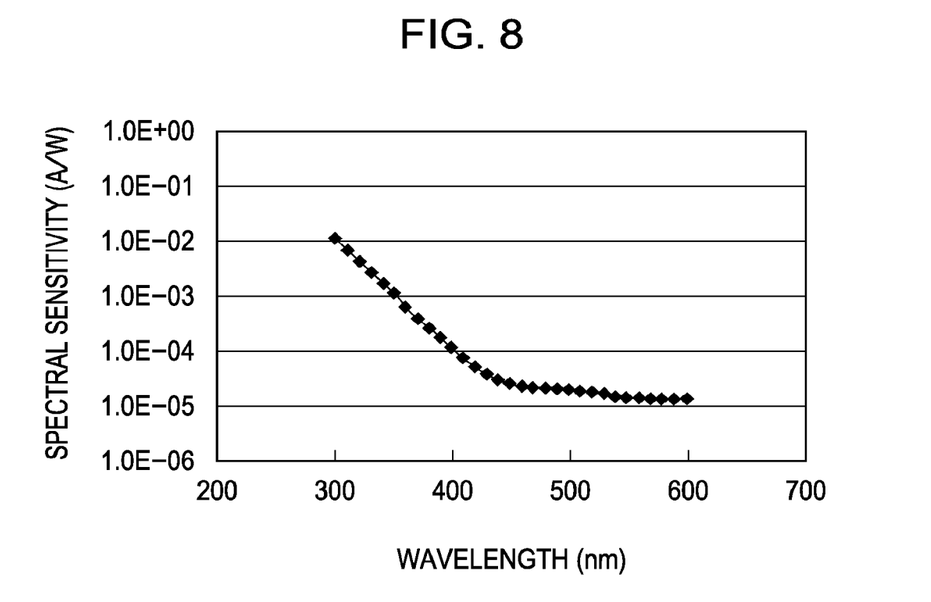
FIG. 8 is a diagram showing results of spectral sensitivity measurement experiments for describing the present invention.

The results shown in FIG. 8 suggest that when a thin-film transistor (TFT) is irradiated with visible light, the OFF current of the TFT changes significantly depending on, in particular, the irradiation intensity of visible light at the shorter-wavelength side. Such a change may affect the stable performance of the TFT.

That is, it has been found for the first time that, in a transparent amorphous oxide which should be transparent to visible light, a change in electrical conductivity occurs, namely, photocarriers are practically generated by irradiation with light in a certain visible light region.

The present inventors have arrived at the understanding on the basis of the finding of the above-mentioned phenomenon that when a material which is generally recognized as a transparent oxide is used for the active layer of a TFT, it is preferable that the TFT be provided with a light-shielding structure for shielding the oxide from light in order to operate the TFT with higher stability. On the basis of the above, the present invention relating to transistors including a light-shielding structure has been accomplished.

However, the light-shielding structure may be unnecessary depending on the use of a TFT, i.e., when visible light at the shorter-wavelength side does not enter the TFT or when the incident light does not highly affect the total stability of a device even if the light enters the device.

SUMMARY OF THE INVENTION

The present invention provides a field-effect transistor including a light-shielding structure and provides a display provided with the transistor.

A field-effect transistor according to a first aspect of the present invention includes a substrate, a source electrode, a drain electrode, a gate electrode, a gate-insulating film, and an active layer. The active layer contains an oxide having a transmittance of 70% or more in the wavelength range of 400 to 800 nm. As a light-shielding structure, a light-shielding layer is provided between the substrate and the active layer or is provided on the surface of the substrate on the side opposite the active layer, or the substrate has a light-shielding property.

A field-effect transistor according to a second aspect of the present invention includes a substrate, a source electrode, a drain electrode, a gate electrode, a gate-insulating film, and an active layer. The active layer contains an oxide having a transmittance of 70% or more in the wavelength range of 400 to 800 nm. As a light-shielding structure, a light-shielding layer is provided over the active layer. The light-shielding structure shields light entering from all directions which form angles of less than 90 degrees with the direction along the surface of the substrate toward the active layer.

A field-effect transistor according to a third aspect of the present invention includes a substrate, a source electrode, a drain electrode, a gate electrode, a gate-insulating film, an active layer, and a light-shielding film. The active layer contains an oxide having a transmittance of 70% or more in the wavelength range of 400 to 800 nm. As a light-shielding structure, a light-shielding film is provided over the active layer.

The light-shielding structure according to the first to the third aspects of the present invention is a film having a light-shielding property to light having a wavelength range of 400 to 800 nm or a film having a light-shielding property to light or an electromagnetic wave having a wavelength range of around 400 nm (wavelengths ranging at least from 300 nm to 500 nm).

A display according to a fourth aspect of the present invention includes a plurality of pixel parts each provided with the above-described field-effect transistor and a liquid-crystal layer or a light-emitting layer.

Further features of the present invention will become apparent from the following description of exemplary embodiments with reference to the attached drawings.

DESCRIPTION OF THE EMBODIMENTS

In general, the term "visible light" indicates light having a wavelength range of about 400 nm to about 800 nm. In addition, generally, a material having a light transmittance of 70% or more is recognized as a transparent material. FIG. 2 in the above-mentioned Non-Patent Document shows that the amorphous oxide relating to the present invention has a transmittance of 70% or more.

Therefore, in the present invention, an oxide having a light transmittance of 70% or more in the wavelength range of 400 to 800 nm (visible light) is defined as a transparent oxide. The transparent oxides in the present invention include not only oxides having a light transmittance of 70% or more throughout the above-mentioned light wavelength range but also oxides having a light transmittance of 70% or more in a part of the above-mentioned light wavelength range.

In addition, the transmittance in the wavelength of the above-mentioned range is preferably 80% or more, more preferably 90% or more.

First Embodiment: Light Shield to Incident Light from Substrate Side

Figure 1:
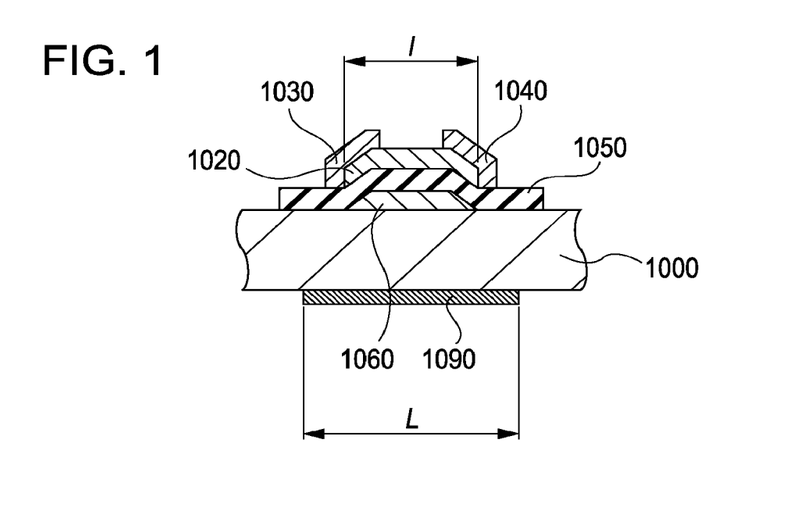
FIG. 1 is a schematic cross-sectional view of a field-effect transistor according to the present invention.
Figure 2:
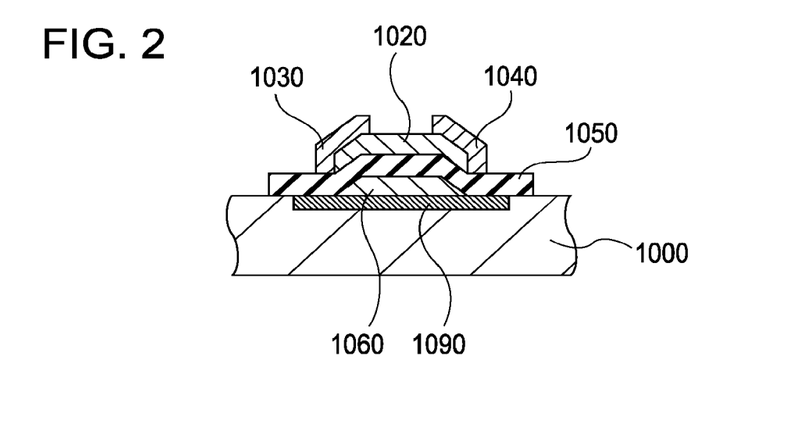
FIG. 2 is a schematic cross-sectional view of a field-effect transistor according to the present invention.
Figure 3:
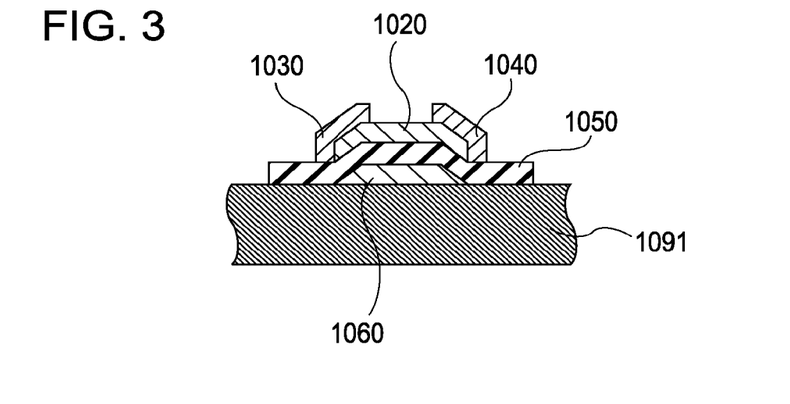
FIG. 3 is a schematic cross-sectional view of a field-effect transistor according to the present invention.

Light entering from the substrate side toward the active layer is shielded when light-shielding films are provided at the positions shown in FIGS. 1 to 3.

Preferably, the light-shielding film has a light-shielding property to visible light having a wavelength range of 400 to 800 nm. More preferably, the light-shielding film further has a light-shielding property to light or an electromagnetic wave having a wavelength of 400 nm or less (for example, the wavelength range of 100 to 400 nm).

The transparent oxide (for example, transparent amorphous oxide) in the present invention causes a phenomenon of photocarrier generation in the shorter-wavelength region of visible light. Therefore, in particular, it is preferable that the light-shielding film have a light-shielding property to at least light or an electromagnetic wave having a wavelength range of 300 to 500 nm.

In addition, the light-shielding film is not required to have a transmittance of 0% as long as the light-shielding film has a light-shielding property to light having the above-mentioned wavelength. The transmittance is preferably 30% or less, more preferably 10% or less, more preferably 5% or less, and further preferably 0.01% or less.

The material for the light-shielding film in the present invention is not specifically limited. The light-shielding property of the material may be low, provided that the light-shielding property which is equivalent to the above-mentioned transmittance can be achieved by increasing the thickness of the film.

The present invention will now be specifically described.

FIG. 1 shows an example of an inverted-staggered TFT provided on a substrate. In FIG. 1, reference numeral 1000 represents a substrate, reference numeral 1020 represents an active layer, reference numeral 1030 represents a source electrode, reference numeral 1040 represents a drain electrode, reference numeral 1050 represents a gate-insulating film, and reference numeral 1060 represents a gate electrode. In addition, a light-shielding film 1090 is provided on the bottom face of the substrate 1000 (on the surface of the substrate 1000 on the side opposite the active layer 1020) as a light-shielding structure.

In order to shield light from the direction perpendicular to the surface of the substrate 1000 (i.e., from directly below the active layer 1020), the width L of light-shielding film 1090 should be equal to or longer than the width l of the active layer 1020. Particularly, in order to sufficiently shield obliquely incident light, the width L of the light-shielding film 1090 should be 2 times or more the width l of the active layer 1020, preferably 4 times more the width l. The light-shielding film 1090 may be provided on the entire surface of the substrate 1000.

FIG. 1 is a schematic cross-section view of a TFT. The length of the light-shielding film 1090 in the direction vertical to the surface of the paper on which FIG. 1 is drawn, in the depth direction, is equal to or larger than (preferably 2 times, more preferably 4 times) that of the active layer 1020.

In FIG. 1, an inverted-staggered TFT is exemplarily described, but the structure of a TFT is not limited to the inverted-staggered type as described below.

FIG. 2 shows an example that a light-shielding film is provided on the top face of a substrate 1000 (on the surface of the substrate 1000 on the active layer 1020 side). This case also has the same relationship between the width l of the active layer 1020 and the width L of the light-shielding film 1090 as that in the above case. In addition, the TFT shown in FIG. 2 may have an additional light-shielding film at the same position shown in FIG. 1 so that light-shielding films are provided on both surfaces of the substrate 1000.

FIG. 3 shows a case that a substrate 1091 itself has a light-shielding property.

Figure 4A:
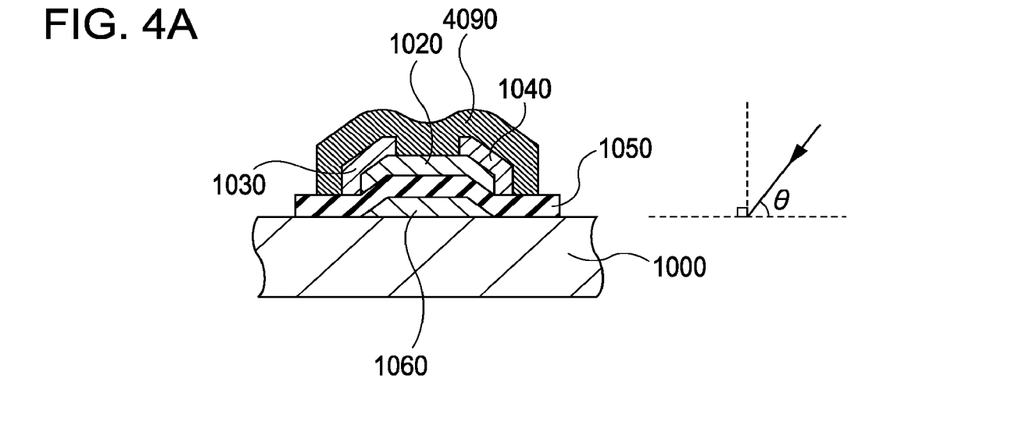
FIGS. 4A to 4C are schematic cross-sectional views of field-effect transistors according to the present invention.

Second Embodiment: Light Shield to Incident Light from the Side Opposite the Substrate In order to shield the incident light from the side opposite the substrate, a light-shielding film 4090 is provided as shown in FIG. 4A.

Preferably, the light-shielding film 4090 has a light-shielding property to visible light having a wavelength range of 400 to 800 nm. More preferably, the light-shielding film further has a light-shielding property to an electromagnetic wave having a wavelength of 400 nm or less (for example, the wavelength range of 100 to 400 nm).

The transparent oxide (for example, amorphous oxide) in the present invention causes a phenomenon of photocarrier generation in the shorter-wavelength region of visible light. Therefore, in particular, it is preferable that the light-shielding film have a light-shielding property to at least light or an electromagnetic wave having a wavelength range of 300 to 500 nm.

In addition, the light-shielding film is not required to have a transmittance of 0% as long as the light-shielding film has a light-shielding property to light having the above-mentioned wavelength. The transmittance is preferably 30% or less, more preferably 10% or less, more preferably 5% or less, and further preferably 0.01% or less.

Specifically, as shown in FIG. 4A, a light-shielding film is further provided independent of a source electrode 1030, a drain electrode 1040, and a gate electrode 1060. With such a structure, the active layer is shielded from light which cannot be shielded by only the electrodes such as the source electrode. In FIG. 4A, an example of an inverted-staggered TFT is described as an example. The present invention can be applied to TFTs having other configurations as described below. In addition, when the light-shielding film is made of a material having a high electrical conductivity, it is necessary to interpose an insulating layer (not shown) between the light-shielding film 4090 and the electrodes such as the source electrode.

Furthermore, as shown in FIG. 4A, light irradiated toward the active layer 1020 from all directions which form angles (indicated by θ in the figure) of less than 90 degrees with the direction along the surface of the substrate 1000 can be shielded by providing the light-shielding film 4090 at the upper side of the active layer 1020.

Figure 4B:
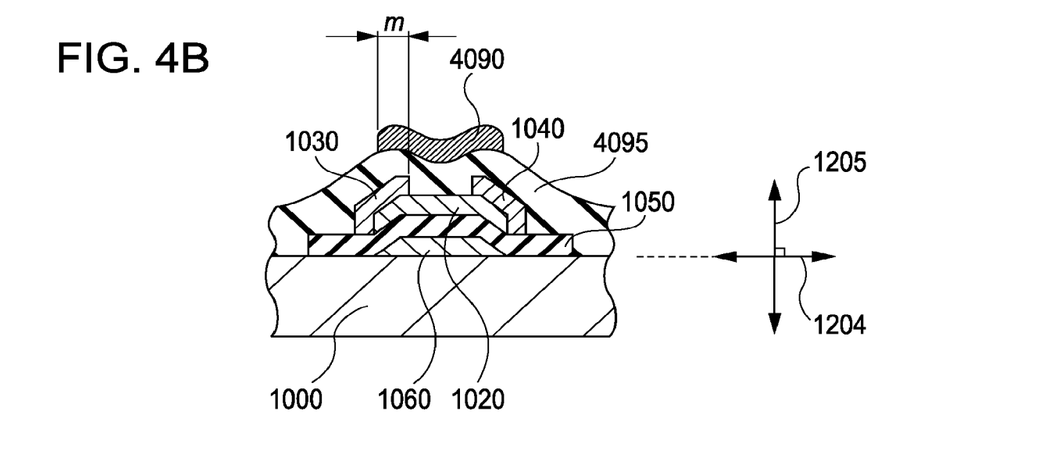

In an inverted-staggered TFT shown in FIG. 4B, a light-shielding film 4090 serves as the light-shielding structure, and an insulating layer 4095 is interposed between the light-shielding film 4090 and a source electrode 1030, an active layer 1020, and a drain electrode 1040. In the structure shown in FIG. 4B, the light-shielding film 4090 is further provided independent of the electrodes such as the source electrode 1030. It is preferable that the light-shielding film 4090 and the source electrode 1030 (and the drain electrode 1040) partially overlap one another when viewed from the direction (indicated by reference numeral 1205 in the figure) perpendicular to the direction (indicated by reference numeral 1204 in the figure) along the surface of the substrate 1000. The width (m) of the overlapped portion is preferably equal to or larger than the thickness of the insulating film 4095 provided directly on the source electrode 1030. It is preferable that the source electrode 1030 and the drain electrode 1040 are completely covered with the light-shielding film 4090 when viewed from the vertical direction (indicated by reference numeral 1205 in the figure).

Figure 4C:
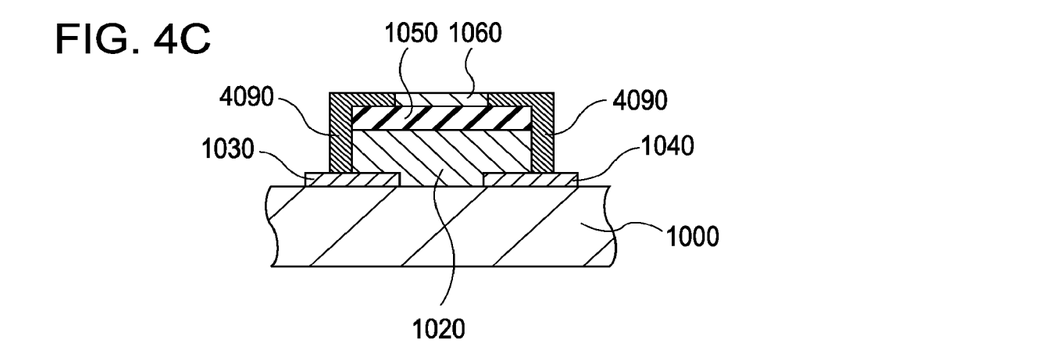

FIG. 4C shows an example of a staggered TFT provided with a light-shielding film 4090 as a light-shielding structure. As in this example, the light-shielding structure may be provided so as to cover the gate-insulating layer 1050 at the portion not being covered with the gate electrode 1060 and to cover the side faces of the active layer (amorphous oxide) 1020.

In addition, the structure in the second embodiment may further include the same constitution as in the first embodiment. Such a structure is included in the scope of the present invention and provides a TFT having a light-shielding property to incident light from the substrate side and from the active layer side.

The first and second embodiments describe examples using a light-shielding member (or a film or a substrate having a light-shielding property) as the light-shielding structure. The light-shielding structure may be a film, layer, or member which achieves the light shielding by absorbing or reflecting light having a predetermined wavelength range. In addition, the light shielding may be achieved by a combination of the absorption and reflection of light. The light-shielding structure may be a multilayer of light-shielding films, light-shielding layers, or light-shielding members. In addition, the light-shielding structure may be a photonic crystal having an optical two- or three-dimensional refractive index difference.

Third Embodiment: Display

A display provided with a field-effect transistor (specifically TFT) described in the first or second embodiment will now be described.

The structure used in a display is as follows:

The drain electrode functioning as an output terminal of a TFT is connected to an input electrode of a light-emitting device such as an electroluminescence device using an organic or inorganic material, a light-transmittance-controlling device of a liquid-crystal cell or an electrophoretic particle cell, or a light-reflectance-controlling device.

Figure 5:
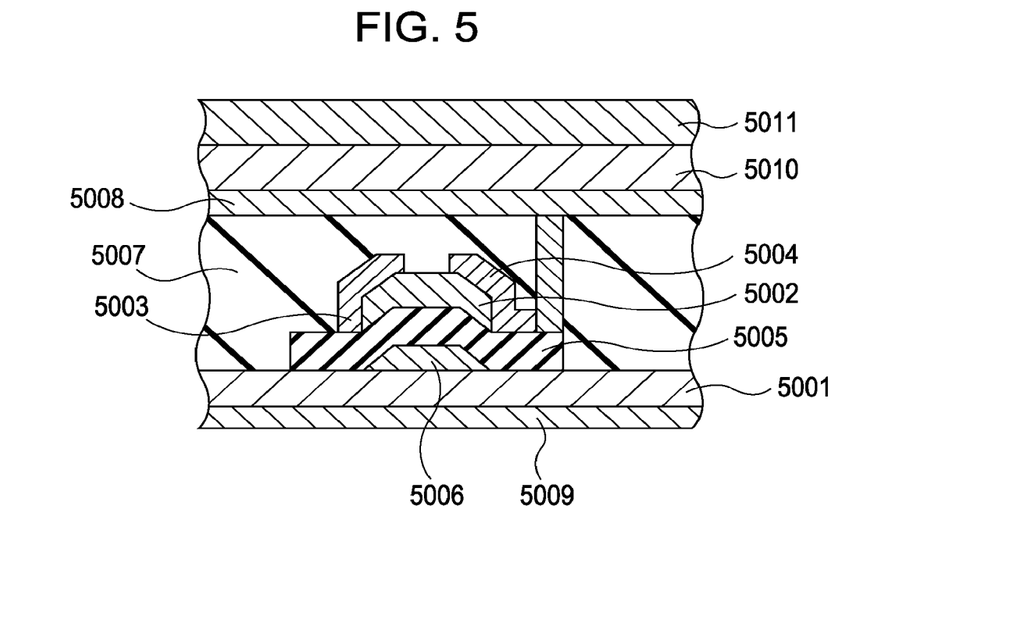
FIG. 5 is a schematic cross-sectional view of a display utilizing a field-effect transistor according to the present invention.

For example, as shown in FIG. 5, an amorphous oxide semiconductor film 5002, a source electrode 5003, a drain electrode 5004, a gate-insulating film 5005, and a gate electrode 5006 are deposited and patterned on a substrate 5001.

The drain electrode 5004 is connected to an electrode 5008 via an interlayer-insulating film 5007. The electrode 5008 is in contact with a light-emitting layer 5010 which is in contact with an electrode 5011. A current flowing into the light-emitting layer 5010 can be controlled by the current value flowing from the source electrode 5003 to the drain electrode 5004 through a channel formed in the amorphous oxide semiconductor film 5002. This control is conducted by the voltage of the gate electrode 5006 of a TFT. Here, the light-emitting layer 5010 is an inorganic or organic electroluminescence device.

In such a device structure, the interlayer-insulating film 5007 or the electrode 5008 serves as a light-insulating film so that the amorphous oxide semiconductor film 5002 is not irradiated with visible light and light or an electromagnetic wave having a wavelength shorter than that of visible light.

The light irradiation from the substrate side is shielded by providing a light-shielding member 5009 on the top or bottom face of the substrate 5001. FIG. 5 shows a case that the light-shielding member 5009 is provided on the bottom.

In addition, the gate electrode 5006 may have a function as a light-shielding film so that it is unnecessary to separately provide the light-shielding member 5009.

When an inorganic or organic electroluminescence device has a top emission structure, it is preferably that the electrode 5008 function as a light-shielding layer.

A liquid-crystal display will now be described with reference to FIG. 6.

Reference numeral 6001 represents a substrate, reference numeral 6002 represents an active layer made of an amorphous oxide, reference numeral 6003 represents a source electrode, reference numeral 6004 represents a drain electrode, reference numeral 6005 represents a gate-insulating electrode, and reference numeral 6006 represents a gate electrode.

Figure 6:
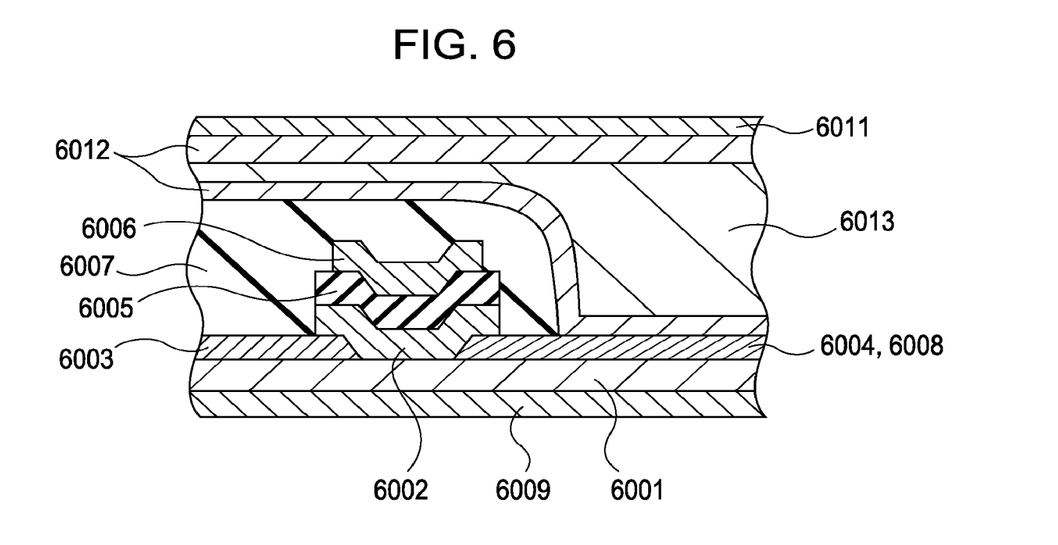
FIG. 6 is a schematic cross-sectional view of a display utilizing a field-effect transistor according to the present invention.

As shown in FIG. 6, the drain electrode 6004 is extended and thereby also serves as an electrode 6008. A light-transmittance-controlling device or light-reflectance-controlling device composed of a liquid-crystal cell or an electrophoretic particle cell 6013 is interposed between high-resistive films 6012 (for example, oriented films of a polyimide).

A voltage is applied to the liquid-crystal cell or the electrophoretic particle cell 6013 by the electrodes 6008 and 6011. With such a structure, the voltage applied between the electrode 6008 and the electrode 6011 can be controlled by controlling the voltage of the gate electrode 6006 of a TFT.

An interlayer-insulating film 6007 serving as a light-shielding layer or a gate electrode 6006 made of an opaque metal such as Al having a light-shielding function may be used so that the active layer 6002 made of amorphous oxide is not irradiated with visible light and not irradiated with light or an electromagnetic wave having a wavelength shorter than that of visible light.

The light irradiation from the substrate 6001 side is preferably shielded by providing a light-shielding film 6009 on the top or bottom face of the substrate 6001. FIG. 6 shows a case that the light-shielding film 6009 is provided on the bottom.

When a device has a structure such that the substrate is not required to have transparency to visible light, the substrate may be formed of a light-shielding member.

The display provided with the transistor described in the first or second embodiment may be a transparent type, a reflective type, or a combination thereof.

(1) Material for Light-Shielding Structure Applied to the First to the Third Embodiments The present invention is characterized by, as described above, that a light-shielding member is provided so that the active layer is not irradiated with visible light and light or an electromagnetic wave having a wavelength shorter than that of visible light from the outside of a TFT.

The light-shielding structure has the following constitution: (a) the substrate itself of a TFT is a light-shielding member, or a layer of a light-shielding member is provided on the top or bottom face of the substrate; (b) a light-shielding layer is provided on the upper portion (the side opposite the substrate) of a TFT (the lower electrode of a light-emitting layer or the high-resistive layer of a liquid-crystal device may also serve as a light-shielding layer); (c) the interlayer-insulating film is formed of a light-shielding member; or (d) some or all electrodes, i.e., the source electrode, drain electrode, and gate electrode, of a TFT are formed so as to have a function as a light-shielding member. The present invention is achieved by a combination optionally selected from the above-mentioned constitution.

Any structure can be optionally used as long as the structure has a light-shielding property. In particular, it is preferable that the transmittance for visible light and light or an electromagnetic wave having a wavelength shorter than that of visible light (wavelength range of 300 to 800 nm) be less than 0.01%.

A deviation in the OFF-current of a TFT caused by light irradiation can be decreased to 1/100 or less by satisfying a condition that the transmittance is less than 0.01%.

Examples of the material of the light-shielding member include metals such as Al, Cr, and Ni; alloys thereof; and silicides. The structure of the light-shielding film may be a multilayer film composed of different materials. In an example composed of three layers, the center layer is made of a material having a high electrical conductivity and a high light-shielding property, and the layers at both sides are made of a material whose light-shielding property is inferior to that of the center layer, but the electrical conductivity is sufficiently lower than that of the center layer.

The light-shielding film may be formed of a high-melting point metal such as Ti, Cr, W, Ta, Mo, or Pb, an alloy containing such a metal, or a silicide. In addition, the light-shielding film may be formed of WSi, WSiN, TiN, WN, amorphous silicon, or polycrystal silicon. Furthermore, the light-shielding film may be formed of an organic material (for example, a resin such as a rubber shielding visible light).

The thickness of the light-shielding film is, for example, in the range of several tens of nanometers to several tens of micrometers.

(2) Types of Field-Effect Transistors to which the First to the Third Embodiments can be Applied The TFTs described in the above-mentioned two examples are bottom-gate inverted-staggered and top-gate staggered types, but the present invention is not limited to these. In the present invention, the TFT may be a coplanar type, an inverted-coplanar type, or other structures as long as a light-shielding member is provided.

Figure 7A:
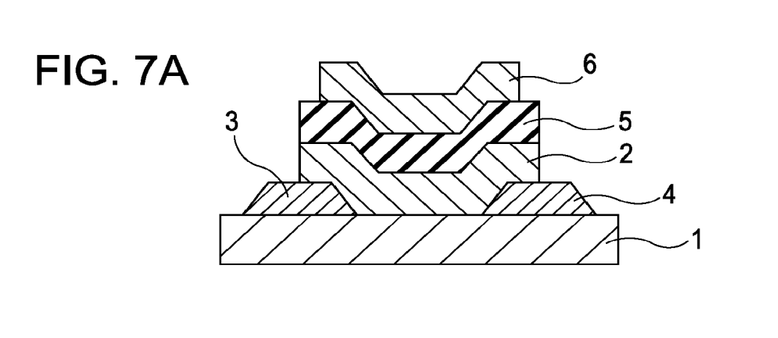
FIGS. 7A to 7D are schematic cross-sectional views of examples of field-effect transistors to which the present invention can be applied.
Figure 7B:
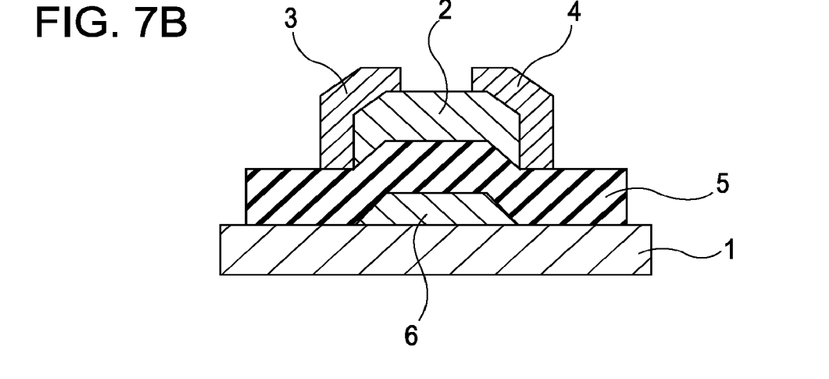
Figure 7C:
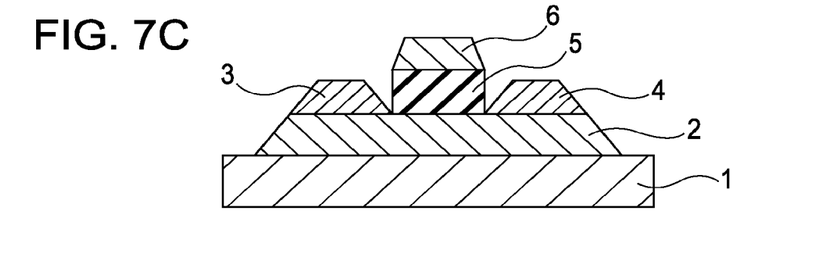
Figure 7D:
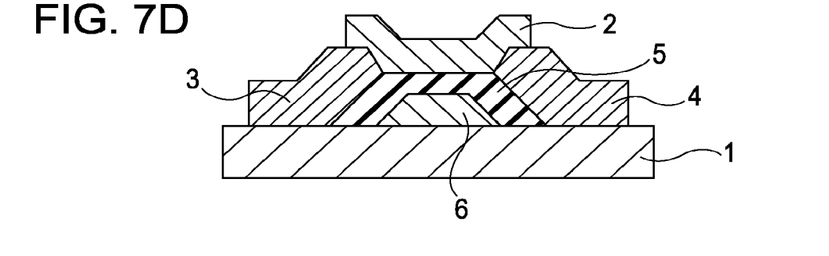

Examples of the structures of TFTs to which the present invention can be applied include, as shown in FIGS. 7A to 7D, a staggered TFT (FIG. 7A), an inverted-staggered TFT (FIG. 7B), a coplanar TFT (FIG. 7C), and an inverted-coplanar TFT (FIG. 7D). In the figures, reference numeral 1 represents a substrate, reference numeral 2 represents an active layer, reference numeral 3 represents a source electrode, reference numeral 4 represents a drain electrode, reference numeral 5 represents a gate-insulating film, and reference numeral 6 represents a gate electrode.

(3) Transparent Oxide Material Applied to the First to the Third Embodiments

Examples of transparent oxides in the present invention include single-crystal oxides, polycrystal oxides, amorphous oxides, and mixtures thereof. The polycrystal oxides may be, for example, ZnO or ITO.

Amorphous oxides which can be applied to the present invention are described in the above-mentioned Patent Document in detail. Hereinafter, cases that an amorphous oxide is used as a material of the active layer will be described.

The active layer for a normally-off TFT may be an oxide film having an electronic carrier concentration of lower than $10^{18}/cm^3$.

Specifically, such an oxide film may have a structure in an In—Ga—Zn—O system, and the composition in the crystalline state is represented by $InGaO_3(ZnO)_m$ (wherein m is an integer less than 6).

In addition, the oxide film may have a structure in an In—Ga—Zn—Mg—O system, and the composition in the crystalline state is $InGaO_3(Zn_{1-x}Mg_xO)_m$ (wherein m is an integer less than 6, and X is denoted by $0<X\leq1$).

The electron mobility of the material for the oxide characteristically increases with the number of conduction electrons. Examples of the substrate for a TFT include glass substrates, plastic resin substrates, and plastic films.

An amorphous oxide film having a low electron carrier concentration and a large electron mobility may be formed of an amorphous oxide composed of an oxide of at least one element selected from Zn, In, and Sn.

The electron mobility of this amorphous oxide film characteristically increases with the number of conduction electrons. A normally-off TFT can be produced by using this film. The normally-off TFT has excellent transistor characteristics such as an ON/OFF ratio, a saturation current in the pinch-off state, and a switching speed.

The semiconductor layer may be an amorphous oxide containing at least one element selected from Sn, In, and Zn.

In addition, when Sn is selected as the at least one element of the amorphous oxide, the Sn may be substituted with $Sn_{1-X}M4_X$ (wherein X is denoted by 0<X<1, and M4 is a Group 4 element having an atomic number less than that of Sn selected from the group consisting of Si, Ge, and Zr).

When In is selected as the at least one element of the amorphous oxide, the In may be substituted with $In_{1-Y}M3_Y$ (wherein Y is denoted by 0<Y<1, and M3 is Lu or a Group 3 element having an atomic number less than that of In selected from the group consisting of B, Al, Ga, and Y).

When Zn is selected as the at least one element of the amorphous oxide, the Zn may be substituted with $Zn_{1-Z}M2_Z$ (wherein the Z is denoted by 0<Z<1, and M2 is a Group 2 element having an atomic number less than that of Zn selected from the group consisting of Mg and Ca).

Specifically, examples of the amorphous material which can be applied to the present invention include Sn—In—Zn oxides, In—Zn—Ga—Mg oxides, In oxides, In—Sn oxides, In—Ga oxides, In—Zn oxides, Zn—Ga oxides, and Sn—In—Zn oxides. The composition ratio of the constituting materials is not limited to 1:1. The amorphous phase of Zn or Sn by itself alone may not be readily produced, but are readily produced by adding In. For example, in an In—Zn system, it is preferable that the composition contains about 20 at % or more of In as an atomic ratio excluding oxygen. In a Sn—In system, it is preferable that the composition contain about 80 at % or more of In as an atomic ratio excluding oxygen. In a Sn—In—Zn system, it is preferable that the composition contains about 15 at % or more of In as an atomic ratio excluding oxygen.

Amorphousness of a film is determined by confirming that no clear diffraction peak is observed (namely, a halo pattern is observed) by X-ray diffraction analysis with a low incident angle of about 0.5 degrees. In addition, in the present invention, when the above-mentioned materials are used in channel layers of field-effect transistors, the channel layers may contain a microcrystalline material. The existence of a microcrystal in an amorphous oxide can be confirmed by observation with a transmission electron microscope, for example.

(4) Substrate and Electrode Materials Applied to the First to the Third Embodiments.

The electrodes of a transistor according to the present invention are formed of materials, such as Al and Au, which have a light-shielding property as previously described. The substrate may be a light-shielding substrate such as an Al-metal substrate, a silicon substrate, or a flexible substrate such as a plastic or PET substrate.

EXAMPLE (Spectral Sensitivity Evaluation Experiment)

First, spectral sensitivity measurement experiments for amorphous oxides according to the present invention will be described in detail.

An oxide of an amorphous In—Ga—Zn system was formed on a substrate by sputtering.

Specifically, the amorphous oxide was deposited on a glass substrate (1737: manufactured by Corning Inc.) so as to have a thickness of 50 nm by high-frequency sputtering in an atmosphere of a gas mixture of oxygen and argon. The target material was a sintered body composed of In:Ga:Zn=1:1:1. The ultimate vacuum in a growth chamber was $8\times10^{-4}$ Pa, the total pressure of oxygen and argon was $5.3\times10^{-1}$ Pa, and the oxygen partial pressure was $1.8\times10^{-2}$ Pa.

The substrate during the forming of the film was not specifically heated. The chamber temperature during the forming of the film was about 30° C. The resulting films were examined by X-ray diffraction analysis (thin film method) with X-ray having an incident angle of 0.5 degrees with respect to the film surface. No clear diffraction peak was detected, and the results confirmed that all the resulting In—Zn—Ga—O films were amorphous.

Furthermore, the pattern analysis of the film was conducted by X-ray reflectometry to confirm that the mean square roughness (Rrms) and the thickness of the thin film were about 0.5 nm and about 50 nm, respectively.

The metal composition ratio of the thin film by fluorescent X-ray analysis (XRF) was In:Ga:Zn=1.00:0.94:0.65. Light-absorption analysis confirmed that the width of the forbidden energy band of the resulting amorphous thin film was about 3.1 eV.

An electrode having a diameter of 1 mm was formed on the thus obtained amorphous oxide film. Specifically, electrodes made of laminated metals of Au (40 nm) and Ti (5 nm) were deposited by a masked evaporation method at intervals of 2 mm. Thus, samples of measurements were prepared. The laminated electrode had the surfacemost layer of Au.

The electrical conductivity of the samples were measured (spectral sensitivity characteristics evaluation) by using a spectrum (at intervals of 10 nm) of a constant light intensity (2.5 mW/cm$^2$) and a bias voltage of 10 V. The measurement was conducted by using a spectral-sensitivity analyzing system, CEP-2000.

FIG. 8 shows the results.

As shown in FIG. 8, the photoinduced carrier generation and an increase in the electrical conductivity were observed in the amorphous film when the wavelength was shorter than about 450 nm (about 2.8 eV), which is almost the same as an energy of about 3.1 eV corresponding to the width of the forbidden energy band. In addition, the amount of the photoinduced carrier generation in the spectral sensitivity characteristics evaluation depended on the irradiated light intensity.

The above-described experiments have revealed for the first time that it is necessary that a TFT is provided with a light-shielding film in order to be more stably operated even when an amorphous oxide which is thought to be transparent to visible light is used, for example, for the active layer of the TFT.

Example 1

In this EXAMPLE, a staggered (top-gate) MISFET device shown in FIG. 7A was produced.

Firstly, a gold film was laminated on a glass substrate 1 so as to have a thickness of 30 nm and then formed into a drain terminal 4 and a source terminal 3 by photolithography and lift-off. Then, an amorphous film to be used as a channel layer 2 having a metal composition ratio of In:Ga:Zn=1.00:0.94:0.65 was formed by sputtering so as to have a thickness of 30 nm. The conditions for forming the amorphous oxide film were the same as those in the above-described evaluation experiments.

Lastly, a $Y_2O_3$ film to be used as a gate-insulating film was formed by electron beam evaporation, and thereon a gold film was formed. The gold film was formed into a gate terminal by photolithography and lift-off.

Then, a light-shielding member made of aluminum foil was provided on the surface of the glass substrate on the side opposite the TFT so that the TFT part was not irradiated with light from the outside. The light-shielding member of the aluminum foil had a transmittance of less than 0.01% to visible light and light or an electromagnetic wave having a wavelength of less than that of visible light.

The resulting MISFET device was evaluated for I-V characteristics under irradiation with light of a fluorescent lamp from the surface of the glass substrate. The light emitted from the fluorescent lamp had a wavelength range of 350 to 750 nm. The results were that the electron field-effect mobility was 7 cm$^2$/Vs and the ON/OFF ratio was higher than $10^5$. In addition, characteristics of the device were measured in the dark instead of the irradiation with the light of a fluorescent lamp, and no changes were observed in the electron field-effect mobility and the ON/OFF ratio.

For a comparative experiment, a MISFET device sample was prepared. The sample was the same as the above-described staggered (top-gate) MISFET device except that a light-shielding member was not provided.

This MISFET device was evaluated for I-V characteristics under irradiation with light of a fluorescent lamp from the surface side of the glass substrate. It was confirmed that the ON/OFF ratio was decreased by an order of magnitude.

The above-described results have revealed that a light-shielding structure is necessary for stable operation even when an amorphous oxide which is recognized to be transparent is used for the active layer of a TFT.

The field-effect transistors in accordance with the present invention can be utilized as switching devices of liquid crystal displays and inorganic or organic EL displays. In addition, the transistors can be formed on flexible substrates such as plastic films by a low-temperature process, and therefore can be widely applied to not only flexible displays but also IC cards and ID tags. According to the present invention, a novel transistor provided with a light-shielding structure can be provided as a field-effect transistor using an oxide which is recognized to be transparent for the active layer.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2005-305950 filed Nov. 20, 2005, which is hereby incorporated by reference herein in its entirety.

What is claimed is:

1. A display comprising:
a substrate having a surface along a first direction;
a field-effect transistor on the substrate, the field-effect transistor comprising an active layer which is a semiconductor layer, a gate electrode, a gate-insulating film between the active layer and the gate electrode in a second direction perpendicular to the first direction, a first electrode, and a second electrode;
an interlayer-insulating film covering the field-effect transistor;
a light-shielding film arranged between the interlayer-insulating film and the substrate; and
a light-emitting device on the substrate, the light-emitting device comprising a third electrode, a fourth electrode between the third electrode and the interlayer-insulating film, and a light-emitting layer between the third electrode and the fourth electrode,
wherein
the substrate is a light-shielding substrate or a silicon substrate,
the first electrode is arranged to overlap a first portion of the active layer in the second direction and is electrically conducted to the active layer,
the second electrode is arranged to overlap a second portion of the active layer in the second direction and is electrically conducted to the active layer,
the first electrode and the second electrode are arranged between the active layer and the interlayer-insulating film in the second direction,
the light-shielding film is arranged to overlap the active layer, the first electrode, and the second electrode in the second direction,
the second electrode is arranged between the light-shielding film and the active layer in the second direction,
the second electrode is connected to the fourth electrode,
the light-emitting device is an electroluminescence device having a top emission structure, and
the light-shielding film is provided independent of the gate electrode.

2. The display according to claim 1, wherein the light-shielding film contains a silicide.

3. The display according to claim 1, wherein the light-shielding film contains Al, Cr, Ni, Ti, Cr, W, Ta, Mo or Pb.

4. The display according to claim 1, wherein
the first electrode and the second electrode are made of metal, and
the light-shielding film is insulated from the first electrode and the second electrode.

5. The display according to claim 1, wherein the substrate is a metal substrate.

6. The display according to claim 1, wherein the light-shielding film, the second electrode and the second portion are arranged between the interlayer-insulating film and the substrate in the second direction.

7. The display according to claim 1, wherein the first electrode is arranged between the light-shielding film and the active layer in the second direction.

8. The display according to claim 1, wherein
a third portion of the active layer does not overlap the first electrode and the second electrode, and
the light-shielding film overlaps the third portion of the active layer.

9. A display comprising:
a substrate having a surface along a first direction;
a field-effect transistor on the substrate, the field-effect transistor comprising an active layer which is a semiconductor layer, a gate electrode, a gate-insulating film between the active layer and the gate electrode in a second direction perpendicular to the first direction, a first electrode, and a second electrode;
an interlayer-insulating film covering the field-effect transistor;
an insulating layer interposed between the interlayer-insulating film and the substrate;
a light-shielding film arranged between the interlayer-insulating film and the substrate; and
a light-emitting device on the substrate, the light-emitting device comprising a third electrode, a fourth electrode between the third electrode and the interlayer-insulating film, and a light-emitting layer between the third electrode and the fourth electrode,
wherein
the substrate is a light-shielding substrate or a silicon substrate,
the first electrode is arranged to overlap a first portion of the active layer in the second direction and is electrically conducted to the active layer, the second electrode is arranged to overlap a second portion of the active layer in the second direction and is electrically conducted to the active layer, the first electrode and the second electrode are arranged between the active layer and the interlayer-insulating film in the second direction, the light-shielding film is arranged to overlap the active layer, the first electrode, and the second electrode in the second direction, the light-shielding film is provided between the interlayer-insulating film and the insulating layer, the insulating layer is interposed between the light-shielding film and each of the active layer, the gate electrode, the first electrode, and the second electrode in the second direction, the second electrode is connected to the fourth electrode, the light-emitting device is an electroluminescence device having a top emission structure, and the light-shielding film is provided independent of the gate electrode.

10. The display according to claim 9, wherein the first electrode and the second electrode are arranged between the insulating layer and the active layer in the second direction.

11. The display according to claim 1, wherein the light-shielding film is provided independent of the first electrode and the second electrode.

12. The display according to claim 1, wherein the interlayer-insulating film is arranged between the field-effect transistor and the light-emitting device, and the interlayer-insulating film is partially arranged between the second electrode and the fourth electrode in the second direction.

13. The display according to claim 1, wherein the active layer contains an oxide.

14. The display according to claim 13, wherein the oxide contains In and at least one of Ga, Zn and Sn.

15. The display according to claim 9, wherein the active layer contains a transparent oxide.

16. The display according to claim 1, wherein the fourth electrode overlaps the first electrode and the second electrode in the second direction.

17. The display according to claim 1, wherein the display is configured so that a current flowing into the light-emitting layer is controlled by a current flowing between the first electrode and the second electrode through a channel formed in the active layer.

18. A display comprising:

a substrate having a surface along a first direction;

a field-effect transistor on the substrate, the field-effect transistor comprising an active layer which is a semiconductor layer, a gate electrode, a gate-insulating film between the active layer and the gate electrode in a second direction perpendicular to the first direction, a first electrode, and a second electrode;

an interlayer-insulating film covering the field-effect transistor;

a light-shielding film arranged between the interlayer-insulating film and the substrate; and a light-emitting device on the substrate, the light-emitting device comprising a third electrode, a fourth electrode between the third electrode and the interlayer-insulating film, and a light-emitting layer between the third electrode and the fourth electrode, wherein the substrate is a light-shielding substrate or a silicon substrate, the first electrode is arranged to overlap a first portion of the active layer in the second direction and electrically conducted to the active layer, the second electrode is arranged to overlap a second portion of the active layer in the second direction and electrically conducted to the active layer, the light-shielding film is arranged to overlap the active layer in the second direction, the second electrode is arranged between the light-shielding film and the active layer in the second direction, the light-emitting device is an electroluminescence device having a top emission structure, the light-shielding film is provided independent of the gate electrode, the active layer is arranged between the light-shielding film and the substrate in the second direction, the active layer contains an oxide, and the display comprises a plurality of pixel parts each provided with the field-effect transistor.

19. The display according to claim 18, wherein the active layer contains at least one of an amorphous oxide and a polycrystal oxide.

20. The display according to claim 18, wherein the active layer contains at least one of an amorphous oxide and a microcrystalline material.

21. The display according to claim 18, wherein the first electrode and the second electrode are arranged between the active layer and the interlayer-insulating film in the second direction, and wherein the light-shielding film is insulated from the first electrode and the second electrode.

22. The display according to claim 18, wherein the first electrode is arranged between the light-shielding film and the active layer in the second direction.

23. The display according to claim 18, wherein the oxide contains In and at least one of Ga, Zn and Sn.

24. A display comprising:

a substrate having a surface along a first direction;

a field-effect transistor on the substrate, the field-effect transistor comprising an active layer which is a semiconductor layer, a gate electrode, a gate-insulating film between the active layer and the gate electrode in a second direction perpendicular to the first direction, a first electrode, and a second electrode;

an interlayer-insulating film covering the field-effect transistor;

a light-shielding film arranged between the interlayer-insulating film and the substrate; and a light-emitting device on the substrate, the light-emitting device comprising a third electrode, a fourth electrode between the third electrode and the interlayer-insulating film, and a light-emitting layer between the third electrode and the fourth electrode, wherein the substrate is a light-shielding substrate or a silicon substrate, the first electrode is arranged to overlap a first portion of the active layer in the second direction and electrically conducted to the active layer, the second electrode is arranged to overlap a second portion of the active layer in the second direction and electrically conducted to the active layer, the light-shielding film is arranged to overlap the active layer in the second direction, the second electrode is arranged between the light-shielding film and the active layer in the second direction, the light-emitting device is an electroluminescence device having a top emission structure, the light-shielding film is provided independent of the gate electrode,
the gate electrode is arranged between the active layer and the substrate in the second direction,
the active layer contains an oxide, and
the display comprises a plurality of pixel parts each provided with the field-effect transistor.

25. The display according to claim 24, wherein the first electrode and the second electrode are arranged between the active layer and the interlayer-insulating film in the second direction.

26. The display according to claim 24, wherein the first electrode is arranged between the light-shielding film and the active layer in the second direction.

27. The display according to claim 24, further comprising an insulating layer interposed between the light-shielding film and the active layer in the second direction.

28. The display according to claim 27, wherein the insulating layer is interposed between the light-shielding film and both the first electrode and the second electrode in the second direction.

29. The display according to claim 24, wherein the oxide contains In and at least one of Ga, Zn and Sn.

30. The display according to claim 24, wherein the active layer contains at least one of an amorphous oxide and a polycrystal oxide.

* * * * *